(12) United States Patent
Chen et al.

(10) Patent No.: US 7,811,720 B2
(45) Date of Patent: Oct. 12, 2010

(54) UTILIZING COMPENSATION FEATURES IN PHOTOLITHOGRAPHY FOR SEMICONDUCTOR DEVICE FABRICATION

(75) Inventors: Kuei Shun Chen, Hsin-Chu (TW); Chin-Hsiang Lin, Hsinchu (TW); Chih-Cheng Chiu, Xinzhung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1567 days.

(21) Appl. No.: 11/044,517

(22) Filed: Jan. 27, 2005

(65) Prior Publication Data

US 2005/0250021 A1  Nov. 10, 2005

Related U.S. Application Data

(63) Continuation-in-part of application No. 10/842,065, filed on May 10, 2004, now Pat. No. 7,202,148.

(51) Int. Cl.
*G03F 1/00* (2006.01)
(52) U.S. Cl. .............................. 430/5; 430/311; 430/394
(58) Field of Classification Search .................. 430/5, 430/311; 716/19, 21
See application file for complete search history.

(56) References Cited

U.S. PATENT DOCUMENTS

| | | | | |
|---|---|---|---|---|
| 5,340,700 A | * | 8/1994 | Chen et al. | 430/312 |
| 5,424,154 A | * | 6/1995 | Borodovsky | 430/5 |
| 6,103,428 A | * | 8/2000 | Hatai et al. | 430/5 |
| 6,492,097 B1 | * | 12/2002 | Chen et al. | 430/394 |
| 2002/0172872 A1 | * | 11/2002 | Hoshino | 430/5 |
| 2004/0069745 A1 | * | 4/2004 | Ho et al. | 216/41 |
| 2005/0123841 A1 | * | 6/2005 | Pierrat | 430/5 |

* cited by examiner

*Primary Examiner*—Mark F Huff
*Assistant Examiner*—Rashid Alam
(74) *Attorney, Agent, or Firm*—Duane Morris LLP

(57) ABSTRACT

A photomask set includes at least two masks that combine to form a device pattern in a semiconductor device. Orthogonal corners may be produced in a semiconductor device pattern to include one edge defined by a first mask and an orthogonal edge defined by a second mask. The mask set may include a first mask with compensation features and a second mask with void areas overlaying the compensation features when the first and second masks are aligned with one another, such that the compensation features are removed when patterns are successfully formed from the first and second masks. The compensation features alleviate proximity effects during the formation of device features.

12 Claims, 9 Drawing Sheets

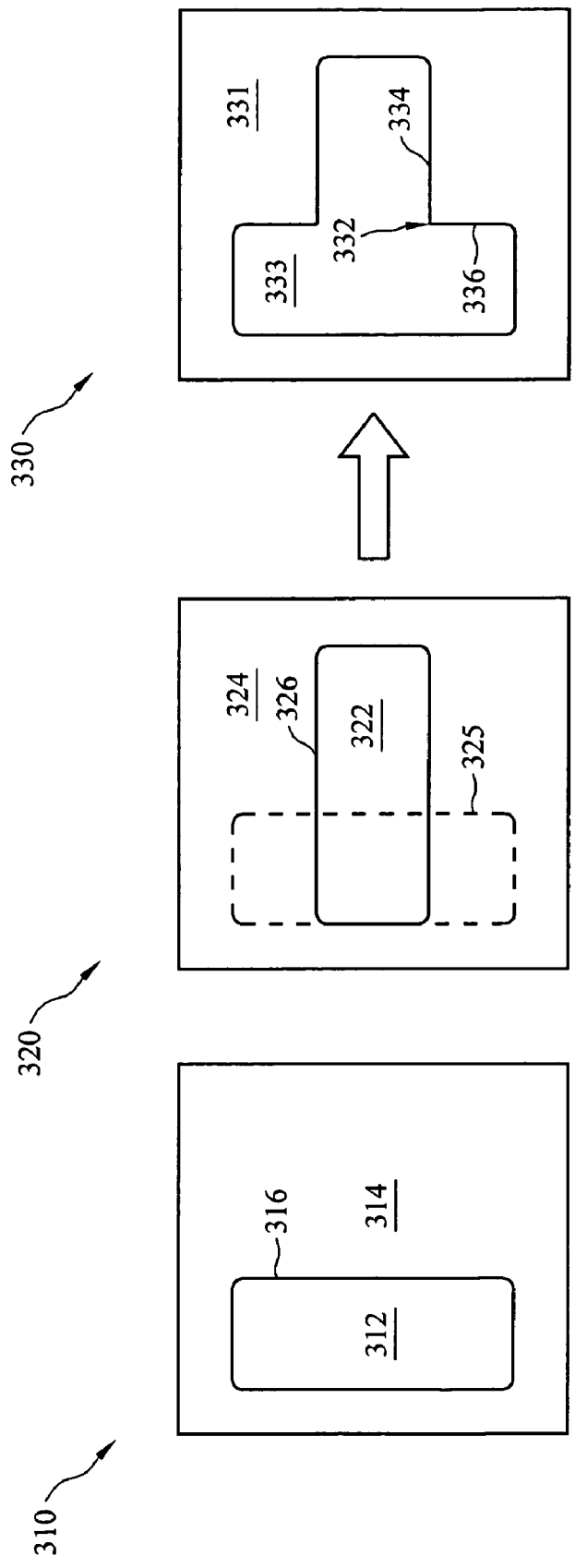

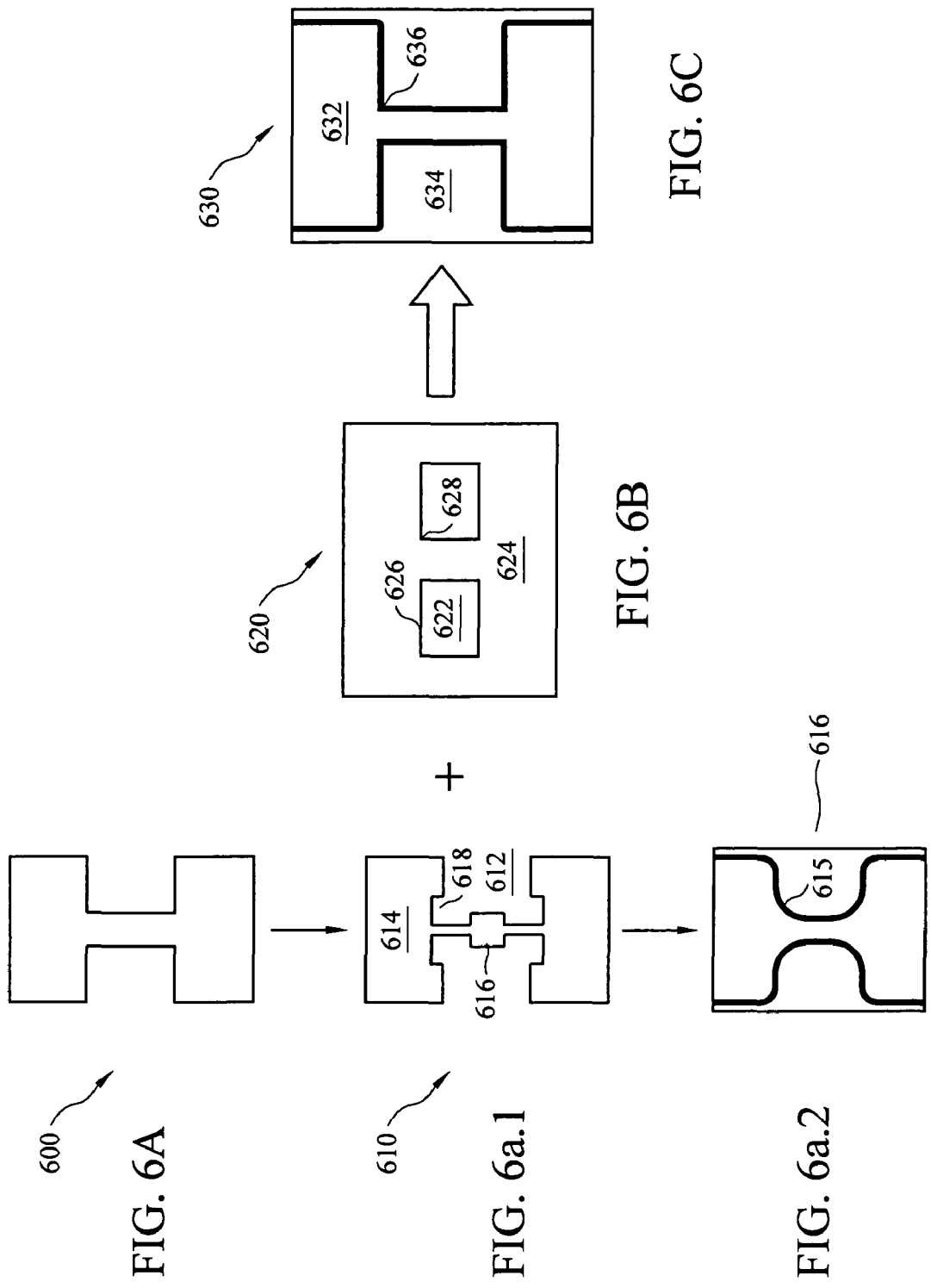

UTILIZING COMPENSATION FEATURES IN PHOTOLITHOGRAPHY FOR SEMICONDUCTOR DEVICE FABRICATION

RELATED APPLICATION

This application is a continuation-in-part of U.S. patent application Ser. No. 10/842,065, filed May 10, 2004 now U.S. Pat. No. 7,202,148.

FIELD OF THE INVENTION

The present invention relates most generally, to photolithography and etch processes in semiconductor device manufacturing. More particularly, the present invention relates to a photomask system for decreasing the proximity effect and improving the definition of device features.

BACKGROUND

In today's rapidly advancing semiconductor manufacturing industry, the demand for increasing levels of device integration requires that device features are made increasingly smaller and in closer proximity to one another. The most critical steps in defining and ultimately producing device features are the photolithography and etching operations. As such, higher levels of device integration will likely be enabled by technological advances in the photolithography and/or etch processes. In order to meet this demand, processes for increasing photomask resolution, such as the process of optical proximity correction (OPC), are put forward constantly.

The object of OPC is to eliminate the phenomenon of the proximity effect in photolithography. In metal-oxide-semiconductor (MOS) devices, each of the several component layers, i.e., film layers and implant levels, is patterned using a photolithography step. Photolithography entails coating a substrate, such as a semiconductor wafer, with a photosensitive film commonly called photoresist, then exposing the photosensitive film by projecting light through a photomask that includes transparent areas and an opaque pattern. The photomask pattern is transferred to the photoresist layer producing a photoresist pattern which acts as a mask for subsequent doping or etching procedures.

A light beam that travels along the edge of an opaque feature produces a scattering phenomenon that enlarges the light beam and produces a scattering effect that distorts the pattern being formed. When the light beam passes through the photoresist layer on the substrate, it also reflects off the substructure beneath the photoresist layer and the phenomenon of interference results. As such, various phenomenon influence the projection of an opaque pattern from a photomask onto a photoresist layer. The smaller the critical dimension of the pattern features are, the more prominent these phenomenon become, especially when the critical dimension approaches half of the wavelength of the light source for exposure.

These exposure phenomenon combine to create the proximity effect which causes problems when densely packed features such as tightly packed parallel lines or intersecting lines undergo exposure at the same time. A corner formed of orthogonally intersecting lines in a mask pattern frequently produces an undesirably rounded structure when transferred to the device layer due to the proximity effect which causes light to scatter from the proximate orthogonal edges of the mask pattern. The proximity effect is greater closer to the intersection of the lines and causes rounding of the corner intersection, even though distal portions of the intersecting lines may be printed substantially straight.

The use of scattering bars represents one OPC technique used to correct and reduce the proximity effect in the photolithography process and to correct for mask bias differences between nested and isolated straight lines. This technique is not available to compensate for the proximity effect when substantially orthogonal lines intersect and the proximity effect increases toward the intersection.

It would therefore be desirable to eliminate the proximity effect at the intersection of orthogonal lines and produce device features with orthogonal corners that are accurately formed and do not exhibit rounding effects.

SUMMARY OF THE INVENTION

To address these and other objects, and in view of its purposes, one aspect of the invention provides a photomask set including at least two photomasks that combine to produce a device pattern in a level of a semiconductor device. The photomask set includes a first mask with a first mask pattern and a second mask with a second mask pattern, the first and second masks alignable over one another to produce the device pattern including at least one substantially orthogonal corner formed of an opaque first edge of the first mask pattern and an opaque second edge of the second mask pattern.

In another aspect, the invention provides a photomask set for forming a single pattern in a device level of a semiconductor device, the photomask set comprising a first mask usable to form a first pattern that is transferable to a device layer and a second mask usable to form a second pattern that is transferable to the device layer and alignable with the first pattern to combine to form the single pattern that includes at least one substantially orthogonal corner formed of a first edge defined by the first pattern and a substantially orthogonal second edge defined by the second pattern.

In another aspect, the invention provides a semiconductor device comprising a pattern formed in a device layer. The pattern includes a duality of linearly aligned leads with ends that face each other. Each end includes at least one corner having a radius of curvature less than 110 nanometers.

In another aspect, the invention provides a photomask set comprising at least two masks including a first mask with a first mask pattern having opaque and transparent portions and a second mask with a second mask pattern having opaque and transparent portions, the first and second masks coordinated with one another for separate projection onto a same surface wherein, when the first mask pattern is aligned over the second mask pattern, orthogonal corners are formed by an intersection of a first edge feature of the first mask pattern and a second edge feature of the second mask pattern.

In another aspect, the invention provides a semiconductor device comprising a pattern formed in a device layer wherein the pattern includes at least one substantially orthogonal corner formed of an intersection of a first edge defined by a first photomask pattern and a second edge disposed orthogonal to the first edge and defined by a second mask pattern.

In another aspect, the invention provides a system for forming a pattern in a semiconductor device. The system includes a set of photomasks usable in succession to produce substantially orthogonal edges in a device pattern. The set of photomasks including first mask having a first pattern with a substantially transparent corner defined by an intersection of orthogonally disposed opaque edges and a second mask having a second pattern with a transparent section that encroaches the opaque edges at the corner when the first and second masks are in alignment.

In another aspect, the invention provides a photomask set comprising at least two masks for producing a pattern in a level of a semiconductor device. The photomask set includes a first mask with a device pattern and at least one compensation feature and a second mask with a second mask pattern, the first and second masks alignable over one another such that a void area of the second mask pattern is aligned over the at least one compensation feature.

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Included in the drawing are the following Figures.

FIGS. 3A and 3B are top views of portions of first and second patterns of first and second masks, respectively, of a mask set. FIG. 3C shows a pattern formed by the mask set.

FIGS. 6A and 6B are top views of portions of first and second patterns of first and second masks, respectively, of a mask set. FIG. 6C shows a pattern formed by the mask set.

DETAILED DESCRIPTION

One aspect of the present invention overcomes the limitations of the prior art and provides compensation features such as scattering bars added to a photomask pattern. The compensation features are patterned and etched along with device features, then removed. They may be removed by patterning using a second mask of a set used on a single device level. The compensation features may be used at any of various mask levels and in conjunction with the production of various semiconductor devices. In one embodiment, the compensation features may be scattering bars used in conjunction with an isolated line or an outermost line of an array of lines. The compensation feature is sufficiently wide to improve the depth of focus for isolated or outermost lines of the desired pattern which are situated differently than otherwise similar nested lines. In an another embodiment, the compensation feature may be a line segment connecting two linearly aligned device features. When this exemplary compensation feature is removed, the facing end lines include superior pattern integrity. Another aspect provides a mask set used in sequence to produce a pattern on a device level, in which sharp orthogonal corners are produced in the pattern from edges formed from the respective masks. The method of the present invention does not require an exposure to be carried out with a photoresist pattern already in place and therefore device CD's are not subsequently compromised.

The present invention is applicable to mask levels used to pattern underlying films formed of various materials and thicknesses, and may be used in conjunction with various photoresist materials and various exposure tools such as projection printers and steppers. The present invention may also be used in conjunction with various light sources having various wavelengths.

Figure 1A:
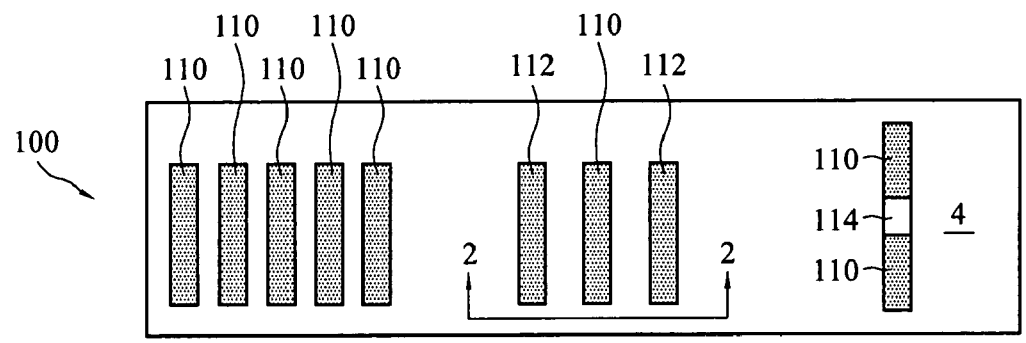
FIG. 1A shows an exemplary first mask pattern and FIG. 1B shows an exemplary compensation mask pattern used in conjunction with the first mask pattern shown in FIG. 1A to produce the device structure shown in FIG. 1C. Each of FIGS. 1A-1C are plan views.
Figure 1B:
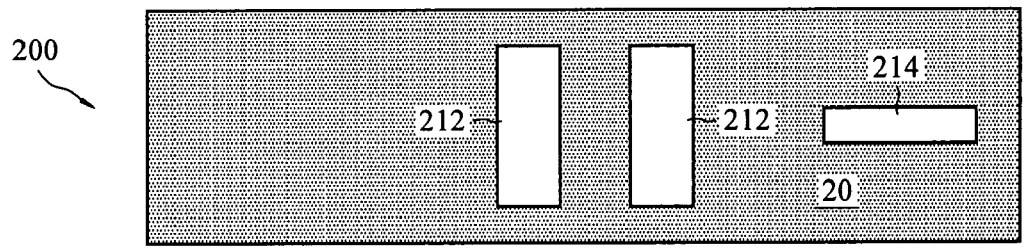
Figure 1C:
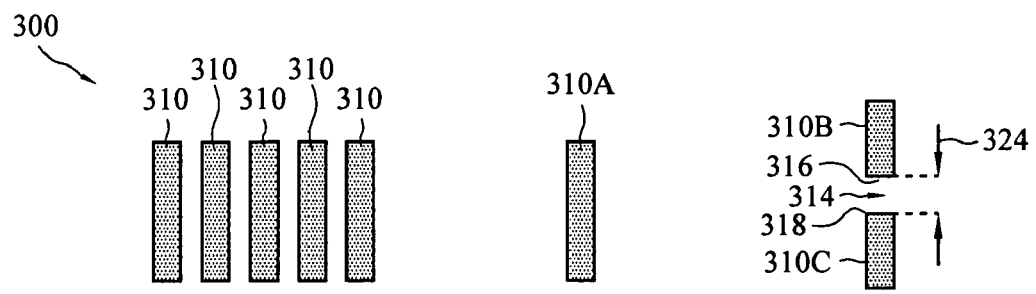

FIGS. 1A-1C are generally horizontally aligned with respect to one another to indicate that if pattern 200 of trim mask 20 is horizontally aligned over pattern 100 of photomask 4, void areas 212 will be aligned over compensation lines 112 to ultimately result in the removal of these features as indicated in pattern 300. Pattern 300 includes device features 310 including device line 310A and device line segments 310B and 310C. Similarly, when void area 214 is aligned over compensation segment 114, space 314 will ultimately result between device line segments 310B and 310C, as will be explained. An advantage of the present invention is the sharp, non-rounded corners at the edges 316 of 310B and 310C that face each other and are spaced apart by distance 324 which may be as small as 130 nm or less. Corner 316 may have a radius of curvature (refer to FIG. 7) less than 110 nm. Compensation lines 112 and compensation segment 114 are compensation features that may take on other shapes in other embodiments.

FIG. 1A shows pattern 100 formed on photomask 4. Pattern 100 may be a pattern used to form any of various levels of a semiconductor device on any of various substrates and includes opaque features 110, 112 and 114 in an otherwise transparent field. Pattern 100 also represents the corresponding pattern formed in a photoresist layer from photomask 4, after expose and develop. Device lines 110 are opaque, typically chrome features used to form structural features in the actual semiconductor device and compensation lines 112 and compensation segment 114 are also opaque, typically chrome features used to increase the process window and provide pattern integrity in the device pattern. While these compensation features 112 and 114 are included in mask 4 and will be translated to corresponding photoresist and etched patterns, they will ultimately be removed, as will be shown in FIGS. 2A-2G.

The mask set shown in FIGS. 1A and 1B and used in combination to produce pattern 300 shown in FIG. 1C, is used with a positive photoresist in which transparent exposed areas are ultimately developed and etched away, and in which opaque features produce corresponding photoresist features and, ultimately, corresponding physical device features. The principles of the present invention also apply to negative photoresist systems in which the converse is true, i.e., light transmissive or void areas in the photomask which become exposed, remain after the develop process which develops away portions of the photoresist that correspond to the opaque pattern and which were not exposed. For simplicity, the previous and following discussions are in terms of positive photoresist, most favored in today's advanced photolithography processes.

Figure 2A:
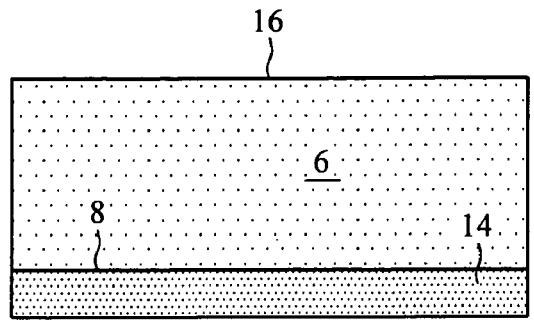
FIGS. 2A-2G are cross-sectional views illustrating a sequence of process operations used to produce a device structural line according to the present invention.

FIGS. 2A-2G are cross-sectional views showing a process sequence used to form a main structural device line. FIG. 2A shows film layer 6 formed over surface 8 of substrate 14. Film layer 6 includes top surface 16. Film layer 6 may be any of various films used in the manufacture of semiconductor devices. For example, film layer 6 may be polysilicon, a polycide, a conductive layer formed of various materials, or any of various other layers used in the manufacture of semiconductor devices. In some exemplary embodiments, film layer 6 may be a composite of more than one film layer. Substrate 14 may be a wafer used in semiconductor manufacturing or it may be a further layer formed over the wafer.

Figure 2B:
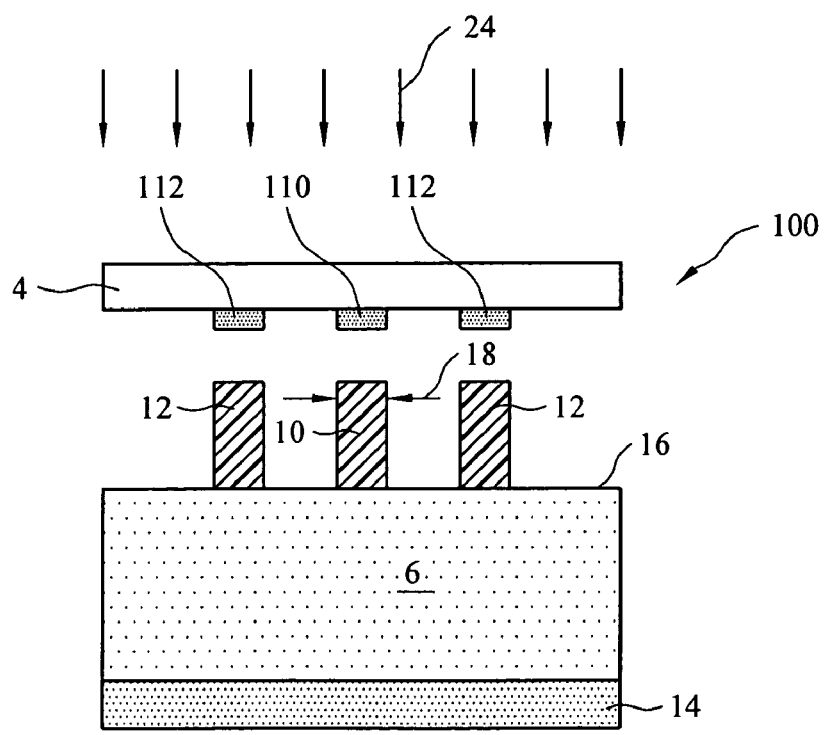

FIG. 2B shows a portion of photomask 4 that generally corresponds to portion 2-2 shown in FIG. 1A. Photomask 4 includes device line 110 and compensation lines 112, each of which are opaque features. Opaque device line 110 is used to form a corresponding isolated main structural feature in the device level formed from film layer 6. Compensation lines 112 are parallel to, and in close proximity to, device line 110. FIG. 2B shows the structure after a photoresist layer was formed over surface 16 then patterned using photomask 4. The patterning involves exposure by light, indicated as arrows 24, then the subsequent developing of the exposed portions of the photoresist layer. Various light sources and wavelengths of light may be used. After patterning, i.e., after exposure and develop, a photoresist pattern is formed to include photoresist lines 10 and 12. The width, i.e., CD or critical dimension 18 of photoresist line 10 will similar to a corresponding critical dimension of a nested line formed elsewhere in the photoresist layer because compensation lines 112 compensate for proximity effects during the exposure process. Photoresist line 10 corresponds to opaque device line 110 of photomask 4 and represents a main structural feature of the semiconductor device. Photoresist lines 12 correspond to opaque compensation lines 112.

Figure 2C:
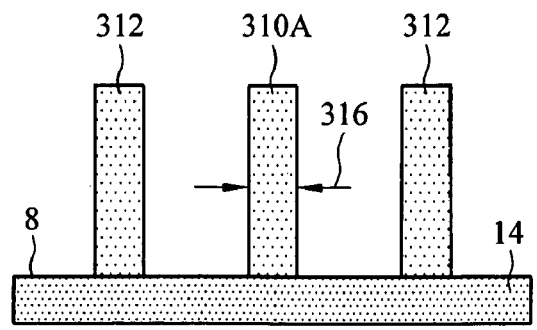

An etching procedure is carried out using the photoresist pattern as a mask and produces a corresponding etched pattern shown in FIG. 2C. Conventional etch processes are known for the various materials that may form film layer 6, and may be used. The etched pattern shown in FIG. 2C includes etched device line 310A and etched compensation lines 312. The etched compensation lines 312 correspond to photoresist lines 12 shown in FIG. 2B and opaque compensation lines 112 of photomask 4. Etched device line 310A corresponds to photoresist line 10 and opaque device line 110 shown in FIG. 2B. Etched device line 310A includes an etched CD 316 that is essentially the same as the corresponding critical dimension of a nested feature (not shown).

Figure 2D:
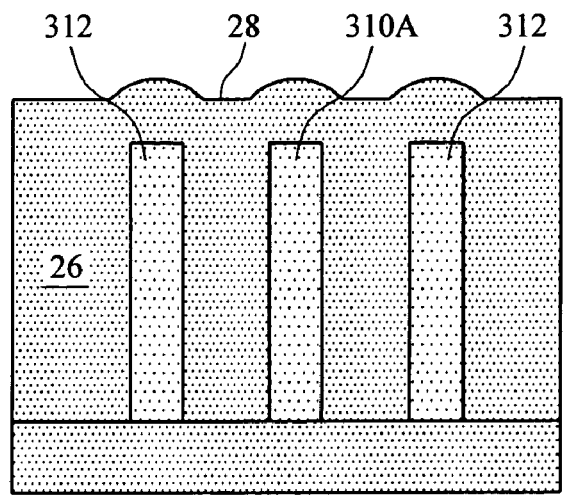

After etching and the subsequent removal of any residual photoresist materials, a protection material is formed over the etched pattern as shown in FIG. 2D. Protection material 26 may be formed by spin coating, chemical vapor deposition (CVD) or other suitable techniques. In one exemplary embodiment, protection material 26 may be an organic material such as another photoresist, BARC (bottom anti-reflective coating) a CVD organic ARC, or various other materials that are chosen in conjunction with a subsequent etching process to produce a high etch selectivity with respect to film layer 6. In one exemplary embodiment, protection material 26 may be substantially planarized such as by chemical mechanical polishing (CMP) or various etch-back procedures. In one particular exemplary embodiment (not shown), top surface 28 may be planarized essentially down to etched lines 310A and 312.

Figure 2E:
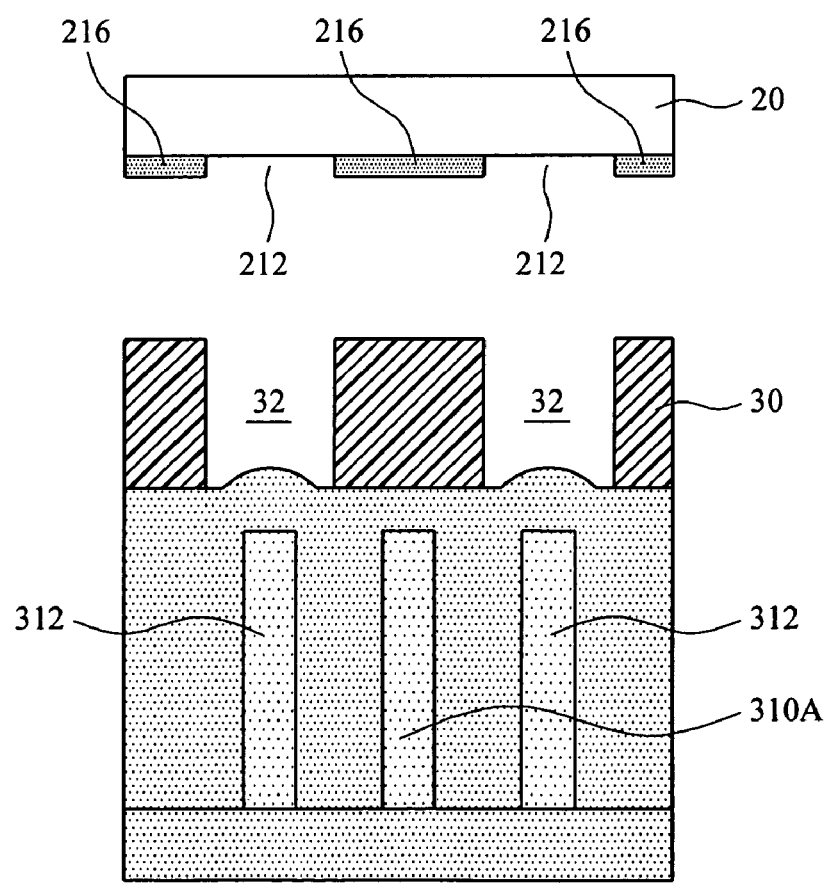

Trim mask 20 including trim pattern 200 is then used to produce a further photoresist pattern in further photoresist layer 30 formed over protection material 26 as shown in FIG. 2E. Trim mask 20 includes opaque areas 216 and void areas 212 which are light transmissive areas aligned over etched compensation lines 312. An expose and develop process sequence is used to form openings 32 in further photoresist layer 30, openings 32 corresponding to void areas 212. Openings 32 are aligned over etched compensation lines 312.

Figure 2F:
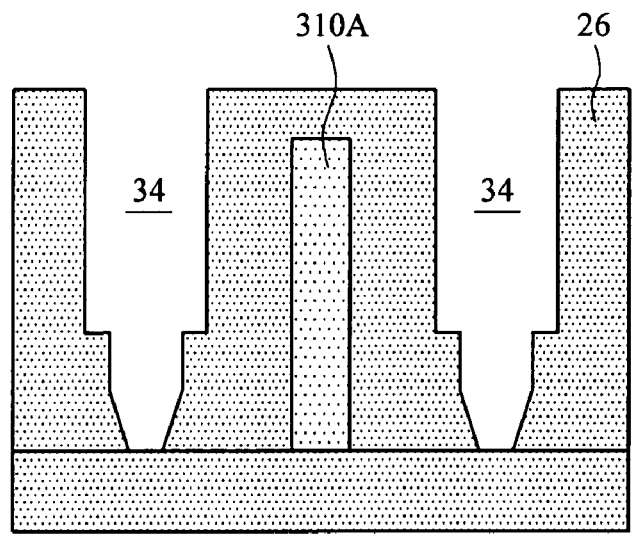
Figure 2G:
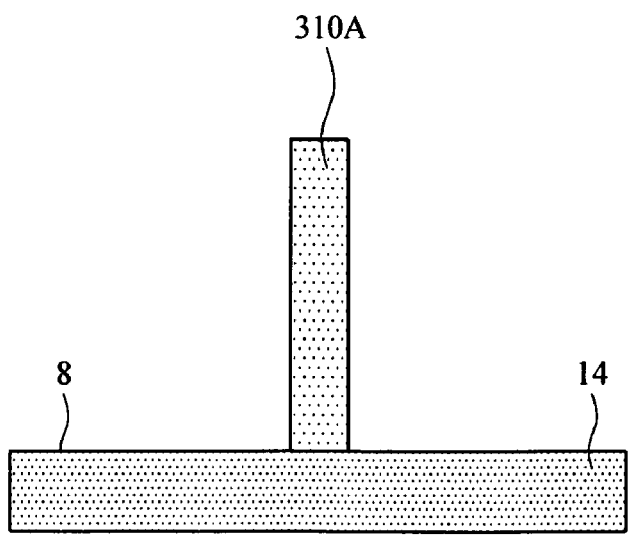

An etching process is then used to etch the areas corresponding to openings 32 and void areas 212 and to produce the structure shown in FIG. 2F. The etching process etches exposed portions of protection material 26 and etched compensation lines 312 to produce openings 34. The high [film layer 6: protection material 28] etch selectivity enables compensation line 312 to be completely removed by the etching process. The etched, main device line 310A remains intact. Various methods are then used to selectively remove protection material 26 to leave etched device line 310A as shown in FIG. 2G. Because compensation lines 312 are ultimately removed using a process that does not compromise the integrity of device line 310A, the widths of compensation lines 112 of photomask 4 need not be restricted. As such, full-size compensation lines 112, also called scatter bars, may be used. Compensation lines 112 may include the same width as opaque line 110 shown in FIG. 2B. This is discussed further in conjunction with FIG. 3.

Although the cross-sectional views illustrated in FIGS. 2A-2G correspond generally to the central device line 110 flanked by compensation lines 112 of FIG. 1A, it should be understood that the structure shown on the right-hand side of FIG. 1A, namely the two linearly aligned device lines 110 with compensation segment 114 therebetween, undergoes the same sequence of processing operations to produce the structure shown in the right hand side of pattern 300 of FIG. 1C, namely, etched device line segments 310B and 310C spaced apart by space 314. After a photoresist line and corresponding etched line are formed to correspond to the composite structure of device line segments 110 and line segment 114 shown in FIG. 1A, void area 214 of trim mask 20 is used to form a void in a photoresist pattern over compensation segment 114. An etching process is then used to produce the etched structure including segments 310B and 310C spaced apart by space 314, corresponding to opaque compensation segment 114. The facing ends of lines 310B and 310C are not defined or adversely affected by the photolithography process and therefore exhibit superior pattern integrity.

In another exemplary embodiment, the mask pattern such as pattern 100 shown in FIG. 1A may additionally include flare dummies disposed throughout the mask level. Flare dummies are opaque features added to the mask level to increase pattern density and therefore assist in automatic endpoint detection. Flare dummies are generally disposed in mask areas lacking other opaque features. Flare dummies are therefore not proximate to active device features. Like compensation lines 112 and compensation segment 114, the flare dummies will also be etched, then removed in a subsequent photolithography and etching operation such as used in the removal of compensation lines 312 shown in FIGS. 2D-2G. Flare dummies may be present in addition to compensation structures and will therefore be removed in the same subsequent etching operation used to remove the compensation features, after patterning with the trim mask.

In another aspect of the present invention, each of the exemplary mask sets shown in FIGS. 3A-3B, 4A-4B, 5A-5B, and 6A-6B are used in sequence to produce a solitary, composite pattern in a layer of a semiconductor device using the process sequence shown in FIGS. 2A-2G. In other words, the first mask pattern is used to produce a first pattern in a photosensitive film which is then transferred to a device level such as by etching or implanting. The first photoresist pattern is then removed and the second mask of the mask set is used to form a different, second pattern in a photoresist material, the second pattern formed over the already partially patterned device level. A further pattern transfer operation such as etching or implanting is then carried out using the second mask pattern. In a sense, the pattern formed in the device level is a composite of the two patterns produced when the respective mask patterns are aligned over one another. Referring to FIGS. 3A, 4A, 5A and 6A, first masks 310, 410, 510 and 610 are used to form a first photoresist pattern that is translated into a device level then the first photoresist pattern is removed and second masks 320, 420, 520 and 620 respectively (FIGS. 3A, 4A, 5A and 6A), are used form second photoresist patterns which are also transferred to the device level. When the pattern transfer operation used to transfer a pattern formed in a photoresist film to an underlying material is etching, a selective etching process is used so that areas which are transparent at both mask levels, and therefore not covered with a photoresist pattern and etched twice, are not overetched or damaged during the second etching operation. The following exemplary embodiments are described with respect to a positive photoresist system in which opaque mask features become the photoresist pattern following exposure and develop, and transparent regions are open areas between the photoresist pattern. The converse is true for negative photoresist systems and it should be understood that aspects of the present invention also apply to negative photoresist systems and their masks of reverse polarity with respect to mask sets used in positive photoresist systems.

FIGS. 3A and 3B show a set of photomasks used in combination to produce a pattern in a single device level of a semiconductor device. First mask 310 includes a pattern that includes opaque sections 314 and transparent sections 312. Edge 316 exists between transparent sections 312 and opaque section 314. Second mask 320 is used in conjunction with first mask 310 and includes a pattern including transparent section 322, opaque section 324 and edge 326 formed between transparent section 322 and opaque section 324. FIG. 3B also shows, in dashed lines, pattern 325 of first mask 310 aligned over the pattern of second mask 320. It should be understood, however, that the second mask pattern is aligned over the semiconductor device level after the features of the first mask have already been translated to the device level. FIG. 3B illustratively indicates the alignment of the first mask pattern over the second mask pattern. First mask 310 and second mask 320 of FIGS. 3A and 3B, respectively, are used such as in a process sequence shown in FIGS. 2A-2G to produce device level pattern 330 shown in FIG. 3C. According to the exemplary embodiment in which the pattern transfer operation is etching, pattern 330 may include unetched areas 331 and etched areas 333 and the edges between the respective areas represent a step between a lower etched area 333 and a higher unetched area 331. Pattern 330 includes substantially orthogonal corner 332 which is formed of the intersection of edge 334 which was produced by edge 326 of second mask 320 and edge 336 which was produced by edge 316 of first mask 310.

Figure 4A:
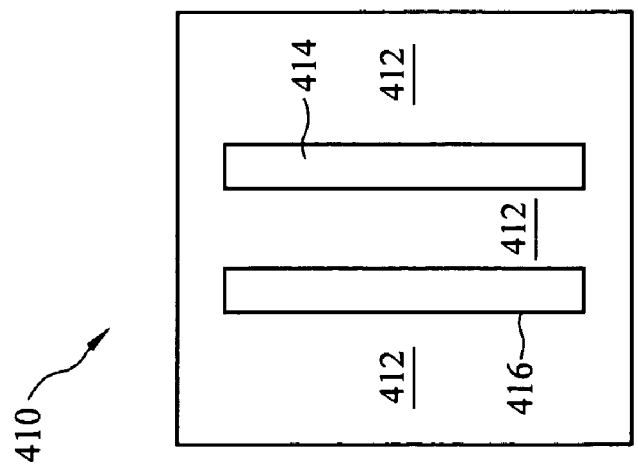
FIGS. 4A and 4B are top views of portions of first and second patterns of first and second masks, respectively, of a mask set.
Figure 4B:
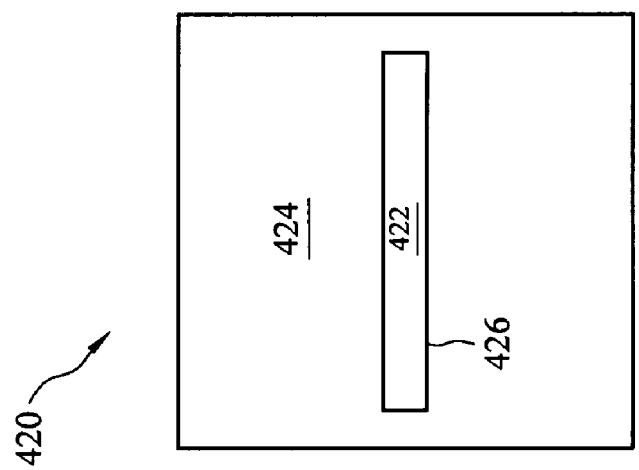
Figure 4C:
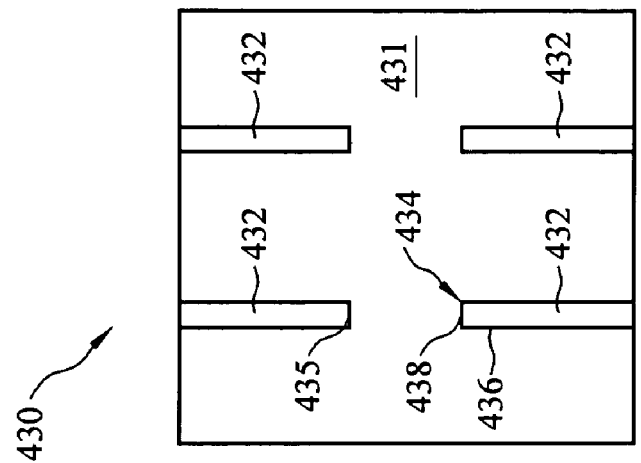
FIG. 4C shows a pattern formed by the mask set.

The same principles apply to the exemplary mask set represented by first mask 410 of FIG. 4A and second mask 420 of FIG. 4B which are sequentially used to produce pattern 430 shown in FIG. 4C. The pattern of first mask 410 includes transparent sections 412, opaque sections 414 and edge 416 between transparent sections 412 and opaque sections 414. The pattern of second mask 420 includes transparent section 422 and opaque sections 424 separated by edge 426. Pattern 430 includes etched areas 431 according to the exemplary embodiment in which the pattern transfer operation is an etching operation, and unetched leads 432. Facing ends 435 of unetched leads 432 includes substantially orthogonal corners 434 formed of the intersection of edge 436 defined by edge 416 of first mask pattern 410 and edge 438 defined by edge 426 of second mask 420.

Figures 5A, 5B, 5C:
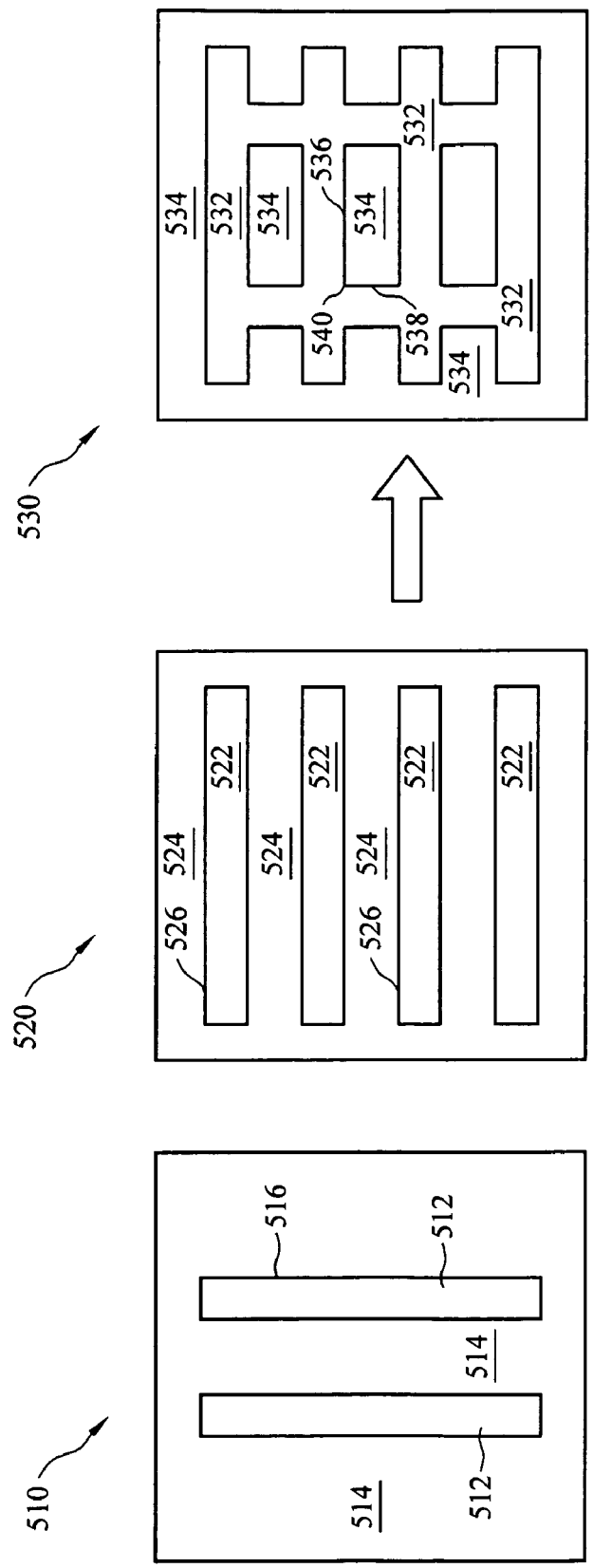
FIGS. 5A and 5B are top views of portions of first and second patterns of first and second masks, respectively, of a mask set.
FIG. 5C shows a pattern formed by the mask set.

FIGS. 5A and 5B show a pattern in first mask 510 and a pattern in second mask 520 used together to produce pattern 530 shown in FIG. 5C. The pattern of first mask 510 includes transparent sections 512, opaque sections 514 and edges 516 that formed a border between transparent sections 512 and opaque sections 514. The pattern of second mask 520 includes opaque sections 524 and transparent sections 522 with edges 526 therebetween. Pattern 530 includes first regions 532 which may be etched regions and second regions 534 which may be unetched regions, the unetched region being those regions protected by photoresist during each of the pattern transfer operations, i.e., regions in which both first mask pattern 510 and second mask pattern 520 are opaque. Pattern 530 includes substantially orthogonal corners 540 that are formed by the intersection of edge 536, defined by edge 526 of first mask pattern 520, and edge 538 which is substantially orthogonal to edge 536. Edge 538 is defined by edge 516 of first mask pattern 510.

FIGS. 6A-6C illustrate another exemplary embodiment. FIG. 6A shows desired pattern 600. First mask pattern 610 shown in FIG. 6A.1 includes opaque regions 614 and transparent regions 612 separated by edge 616. First mask pattern 610 also includes corners 618. Photolithographic methods are used with first mask pattern 610 (FIG. 6A.1) followed by etching, to produce pattern 616 shown in FIG. 6A.2. Pattern 616 included rounded corners 615. OPC (optical proximity correction) techniques may be used to assist in the formation of pattern 616. Second mask pattern 620 of FIG. 6B includes transparent sections 622 and opaque sections 624 with edges 626 therebetween. Corners 628 of second mask pattern 620 are generally aligned over corners 618 of first mask pattern 610. Conventional photolithographic means, or high-resolution photolithography tools such as e-beam or EUV (extreme ultraviolet) radiation may be used to form the pattern of second mask pattern 620 over the etched pattern. A further etching procedure is carried out to produce pattern 630 of FIG. 6C. When the successive patterns from first mask pattern 610 and second mask pattern 620 are successively etched into a device level, device pattern 630 with substantially orthogonal corners 636 is produced. Device pattern 630 includes unetched regions 632 and etched region 634.

In an exemplary embodiment, the device level produced using any of the aforementioned mask sets, may be a polysilicon layer, a polycide stack, a metal layer, a dielectric layer or a layer of various other materials used in the fabrication of semiconductor devices.

Figure 7:
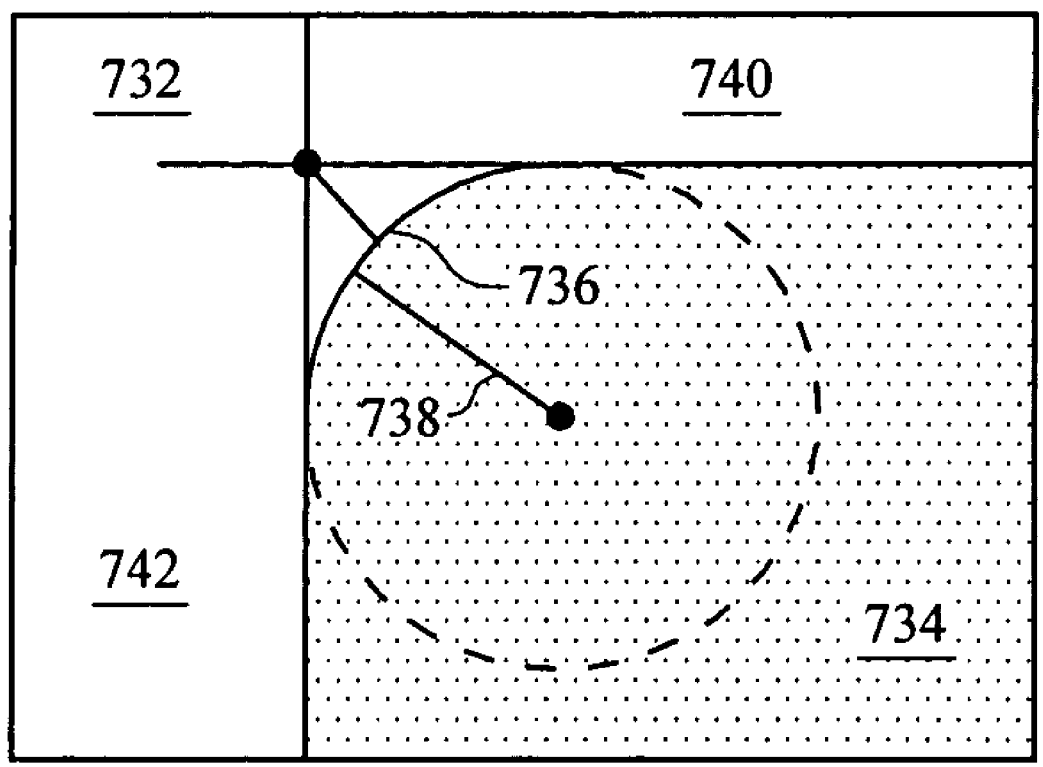
FIG. 7 is a plan view showing a substantially orthogonal corner produced by a mask set of the present invention.

FIG. 7 is an expanded, close-up view of a substantially orthogonal corner 736 produced according to the invention and may represent corner 636 in the northeast portion of FIG. 6C. Corner 736 is formed of the intersection of orthogonal line segments 740 and 742. Corner 736 may include a slight curvature. In the exemplary embodiment, radius of curvature 738 may be 110 nanometers or less. In one exemplary embodiment, portion 734 may be an etched portion such as etched portion 634 of FIG. 6 and portion 732 may be an unetched portion such as unetched portion 632 of FIG. 6. In another exemplary embodiment, portion 734 may be an unetched portion and portion 732 may be an etched portion and corner 736 may represent corner 318 as in FIG. 1C.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the Figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A photomask set for forming a single pattern in a device level of a semiconductor device, said photomask set comprising:
   a first mask usable to form a first pattern that is transferable to a device layer; and
   a second mask usable to form a second pattern that is transferable to said device layer and alignable with said first pattern to combine to form said single pattern that includes at least one substantially orthogonal corner formed of a first edge defined by said first pattern and a substantially orthogonal second edge defined by said second pattern, wherein said first mask is usable to form said first pattern in a first photoresist film that is transferable by a pattern transfer operation into said device layer and said second mask is usable to form a second pattern in a second photoresist film that is transferable by said pattern transfer operation into said device layer, said first photoresist film and said second photoresist film being the same photoresist film type, said photoresist film type being one of positive and negative.

2. A photomask set comprising at least two masks for producing a pattern in a level of a semiconductor device, said photomask set comprising a first mask with a device pattern and at least one compensation feature and a second mask with a second mask pattern, said first and second masks alignable over one another such that a void area of said second mask pattern is aligned over and thereby defines said at least one compensation feature, wherein said device pattern includes a continuous line segment with said at least one compensation feature forming a portion thereof, and said void area intersects said continuous line segment, wherein said device pattern and said second mask pattern each consist of opaque portions and transparent portions.

3. The photomask set as in claim 2, wherein said device features and said at least one compensation feature are opaque and said void area is transparent.

4. The photomask set as in claim 2, wherein said device pattern further includes a device line and said at least one compensation feature further comprises a compensation line segment in close proximity and substantially parallel to said device line.

5. The photomask set as in claim 4, wherein said device line includes a width and said compensation line segment has a width within +/−40 nm of said width.

6. The photomask set as in claim 4, wherein said device line includes a critical dimension of x nm and said compensation line segment has a width greater than 0.5×nm.

7. The photomask set as in claim 4, wherein said compensation line segment is spaced from said device line by at least a distance equal to a minimum spacing of said device pattern.

8. The photomask set as in claim 4, wherein said continuous line segment is substantially orthogonal to said device line.

9. The photomask set as in claim 2, wherein said pattern includes a substantially orthogonal corner formed of an opaque first edge of said device pattern and an opaque second edge of said second mask pattern.

10. The photomask set as in claim 9, wherein said substantially orthogonal corner comprises a radius of curvature of less than 110 nanometers.

11. The photomask set as in claim 2, wherein said device pattern comprises a device line substantially parallel to a further device line and said at least one compensation feature includes a line segment that connects said device line and said further device line to form said continuous line segment.

12. The photomask set as in claim 11, wherein said device line, said further device line and said a line segment are co-linear.

* * * * *